US008680925B2

(12) United States Patent
Christen

(10) Patent No.: US 8,680,925 B2
(45) Date of Patent: Mar. 25, 2014

(54) AMPLIFIER ARRANGEMENT AND METHOD FOR OPERATING AN AMPLIFIER ARRANGEMENT

(75) Inventor: Thomas Christen, Zurich (CH)

(73) Assignee: AMS AG, Unterpremstaetten (AT)

( * ) Notice: Subject to any disclaimer, the term of this patent is extended or adjusted under 35 U.S.C. 154(b) by 56 days.

(21) Appl. No.: 13/429,102

(22) Filed: Mar. 23, 2012

(65) Prior Publication Data

US 2012/0268212 A1      Oct. 25, 2012

(30) Foreign Application Priority Data

Mar. 23, 2011   (DE) .......................... 10 2011 014 843

(51) Int. Cl.
*H03F 3/04*     (2006.01)
(52) U.S. Cl.
USPC .......................................... 330/297; 330/296
(58) Field of Classification Search
USPC .......................................... 330/297, 296, 285
See application file for complete search history.

(56) References Cited

U.S. PATENT DOCUMENTS

| | | | | |
|---|---|---|---|---|
| 5,909,145 A | * | 6/1999 | Zimmerman | 330/128 |
| 6,163,219 A | * | 12/2000 | Kanasugi | 330/282 |
| 6,566,944 B1 | | 5/2003 | Pehlke et al. | |
| 6,646,511 B2 | * | 11/2003 | Canyon et al. | 330/297 |
| 6,831,517 B1 | | 12/2004 | Hedberg | |
| 7,872,533 B2 | * | 1/2011 | Adamski et al. | 330/297 |
| 2008/0061893 A1 | | 3/2008 | Lakshmikumar et al. | |

FOREIGN PATENT DOCUMENTS

WO     WO 2008/120123     10/2008

OTHER PUBLICATIONS

Wu, L. et al.: "Efficient comment-mode feedback circuits for pseudo-differential switched capacitors stages", ISCAS 2000, IEEE International Symposium on Circuits and Systems, May 28-31, 2000, Geneva, Switzerland.
Chae, Y. et al.: "Low Voltage, Low Power, Inverter-Based Switched-Capacitor Delta-Sigma Modulator", IEEE Journal of Solid-State Circuits, vol. 44, No. 2, Feb. 2009.
Fürst, C. E.: "Low Power/Low Voltage Interface Circuitry for Capacitive Sensors: Design, Optimization and Applications", Department of Information Technology, Technical University of Denmark, Mar. 1997.
Hosticka, B, J.: "Dynamic CMOS Amplifiers" IEEE Journal of Solid-State Circuits, vol. sc-15, No. 5, Oct. 1980.
Kim, J. K. et al.: "A 12-bit, 30-MS/s, 2.95-mW Pipelined ADC Using Singel-Stage Class-AB Amplifiers and Deterministic Background Calibration", European Solid-State Circuit Conference, Sep. 2010.
Krummenacher, F.: "Micropower Switched Capacitor Biquadratic Cell", IEEE Journal of Solid-State Circuit, vol. sc-17, No. 3, Jun. 1982.

* cited by examiner

*Primary Examiner* — Henry Choe
(74) *Attorney, Agent, or Firm* — McDermott Will & Emery LLP

(57) ABSTRACT

An amplifier arrangement comprising an amplifier (AMP) with a terminal (SPL) for a supply signal (VSPL) and a bias circuit (BIAS) for providing the supply signal (VSPL) at the terminal (SPL). The bias circuit holds an operating point (OP) of the amplifier (AMP) constant by means of the supply signal (VSPL). The bias circuit (BIAS) comprises a reference circuit (REF) for providing a reference signal (VREF) and a correction device (COR) by means of which the supply signal (VSPL) is regulated based on the reference signal (VREF) and a correction signal (Vfeed), the correction signal (Vfeed) being dependent on the operating point (OP) of the amplifier (AMP). A method for operating an amplifier arrangement is also described.

12 Claims, 3 Drawing Sheets a)　　　　　　　　　　　　　　b)

AMPLIFIER ARRANGEMENT AND METHOD FOR OPERATING AN AMPLIFIER ARRANGEMENT

RELATED APPLICATIONS

This application claims the priority of German application no. 10 2011 014 843.4 filed Mar. 23, 2011, the entire content of which is hereby incorporated by reference.

FIELD OF THE INVENTION

The present invention relates to an amplifier arrangement and a method for operating an amplifier arrangement.

BACKGROUND OF THE INVENTION

Single-stage class-AB amplifiers are among the most effective amplifiers for SC circuits. Single-stage amplifiers have only one current path and achieve a high dynamic range in class-AB operation. SC circuits are driven according to the principle of switched capacitors and are also referred to as switched-capacitor circuits.

A class-AB operation of an amplifier is classified by its operating point, among other things. Floating voltage sources or batteries are frequently used to suitably adjust the operating point. They typically comprise capacitors and must be charged periodically in charging cycles. Operation of the amplifier is impossible during a charging process.

Various approaches to a solution of this problem have so far been proposed. For example, an SC amplifier can be operated by direct DC coupling during a charging cycle. However, this leads to asymmetrical biasing with different input and output operating points. It is also disadvantageous to provide a charging phase differing from the operating state of the amplifier.

SUMMARY OF THE INVENTION

An object of the present invention is to provide an amplifier arrangement and a method for operating an amplifier arrangement that allow precise adjustment of the operating point without interruption by charging cycles.

According to an aspect of the invention, an amplifier arrangement comprises an amplifier with a terminal for a supply signal. A bias circuit is used for providing the supply signal at the terminal for the supply signal. For this purpose, the bias circuit comprises a reference circuit and a correction device.

The bias circuit is set up to hold the operating point of the amplifier constant by means of the supply signal. To accomplish this, a reference signal is first provided by means of the reference circuit. The correction device regulates the supply signal based on the reference signal and a correction signal. The correction signal is dependent on the operating point of the amplifier. Biasing is therefore not provided via a useful signal to be amplified, but via the supply signal.

An advantageous biasing scheme is implemented with the above-described amplifier arrangement and with the bias circuit in particular. Specifically, it is possible to define the operating point of the amplifier without using floating voltage sources or additional capacitors. This has the advantage of avoiding the signal interference that accompanies the capacitors, which usually have to be chosen in large sizes for amplifier circuits. Moreover, biasing is not provided via a useful signal to be amplified, but via the supply signal. Thus the operating point of the amplifier can be adjusted during the normal operation of the amplifier without special operating phases for bias adjustment. The thereby possible continuous operation allows the usage of continuous time circuits.

The correction device regulates the supply voltage and leads to an improved power supply rejection ratio. An improved bandwidth control is possible due to the amplifier's constant operating point. This allows a defined operation, as a class-AB or class-C amplifier with constant settling, for example. The operating point is advantageously also independent of process and temperature variations.

The concept of a signal, for example the reference signal or correction signal, includes the idea that different signal forms may be possible, depending on the embodiment of the invention. A signal can be a current or a voltage, for example.

In according to another aspect of the amplifier arrangement, the amplifier has an amplifier input and an amplifier output.

The amplifier input is suitable for supplying a useful signal to the amplifier. An amplified signal is accordingly emitted at the amplifier output.

In particular, the amplifier arrangement is designed so that the biasing, and accordingly the adjustment of the operating point, does not take place at the amplifier input or the amplifier output, but rather via the separate terminal for the supply signal.

According to another aspect, the reference circuit has a constant transconductance current source.

The reference signal is generated by means of the constant transconductance current source based on a constant transconductance current.

Alongside the output capacitance of the amplifier, the transconductance is a defining parameter for the bandwidth of an amplifier. Because of the close relationship of the transconductance and operating point parameters, it is possible to hold the operating point constant by keeping the transconductance constant. Process and temperature variations can be further minimized by means of this relationship.

According to another aspect, the correction device has a feedback path that is coupled to the reference circuit. Alternatively or additionally, the correction device can also comprise a feedback stage.

By means of the feedback path, it is possible to generate the correction signal based on the useful signal at the amplifier input and/or the amplified signal at the amplifier output. In this manner, the correction signal can be generated directly at the amplifier based on the operating point.

The feedback stage, on the other hand, is set up to mirror the operating point of the amplifier and generate the correction signal in this manner. For instance, the feedback stage can emulate the amplifier by comprising a copy or a scaled copy of the amplifier. In this manner, the operating point of the amplifier can be emulated or mirrored and the correction signal can be generated accordingly by means of the correction device.

According to another aspect of the amplifier arrangement, the correction device comprises a signal regulator. The signal regulator has a regulator input that is connected to one output of an adder and at which a corrected reference signal is present. The signal regulator additionally has a regulator output that is coupled to the reference stage and the terminal for a supply signal.

The adder is used to superimpose the reference signal and the correction signal into a corrected reference signal by means of addition or subtraction. This takes place at a first input, by means of which the reference circuit is present and by means of a second input, via which the adder is connected to the feedback stage.

According to another aspect of the amplifier arrangement, the feedback stage has a transistor-based voltage divider.

The transistor-based voltage divider is preferably connected by means of a diode connection of the voltage divider type, so that the correction signal is adjusted by voltage division or signal scaling. The transistor-based voltage divider is preferably set up for this purpose as an emulation or copy of the amplifier in a certain sense. In this manner, the operating point of the amplifier can be mirrored in the correction device, and in particular, can be adjusted by the transistor-based voltage divider.

In another embodiment of the amplifier arrangement, the amplifier comprises a delay chain with at least one copy of the amplifier. The delay chain, which can also have more than two elements, is connected in series. The at least one copy of the amplifier has a terminal for the supply signal. The correction device further comprises a phase detector, which is connected to the delay chain. A counter is connected to the phase detector and to an input of a digital-to-analog converter. The digital-to-analog converter additionally has an output that is connected to the terminals for the supply signal.

In principle, the operating point of an amplifier determines its transconductance, which, along with the output capacitance, is a determining variable for the bandwidth of the amplifier. There is in turn a connection between the bandwidth of the amplifier and the time delay if this amplifier is used in the delay chain. The operating point can therefore also be regulated with the supply signal by constructing copies of the amplifier, which can be scaled in current and surface area, in the delay chain.

For this purpose, the correction device is set up to generate the correction signal by means of comparison to the reference signal. This is done by comparison to a reference clock signal, which represents the reference signal in this embodiment, and with the assistance of a phase regulation circuit implemented according to the principle of a DLL (delay-locked loop) or PLL (phase-locked loop). The counter is accordingly set up to generate a digital corrected reference signal based on the correction signal. This digital corrected reference signal is present at the digital-to-analog converter or at its input. The digital-to-analog converter subsequently converts the digital corrected reference signal into the corrected reference signal and makes it available at the output. This now analog corrected reference signal is supplied to the terminals for the supply signal in order to regulate the operating point of the amplifier.

This aspect pursues a digital approach in a certain sense, which is especially interesting wherever surface area and current for digital blocks become increasingly smaller (for example in ultra-small scale CMOS integration, Deep-submicron CMOS). Moreover, the reference signal can be kept within defined limits, in contrast to an analog solution, in which the reference signal typically follows a Gaussian distribution. This solution is applied if, due to the finite resolution of the digital reference signal in comparison to an analog solution, larger errors are not of great importance. To achieve high precision, a large number of bits can be chosen for the digital counter and digital-to-analog converter.

According to another aspect of the amplifier arrangement, the amplifier comprises an SC circuit according to the switched capacitor principle.

According to another aspect of the amplifier arrangement, the SC circuit can be connected for offset compensation to the amplifier output with a potential.

In switched capacitor circuits, an input offset of a single input/single output amplifier, for example, is not precisely defined because a virtual potential is generally not available. A so-called correlated double sampling (CDS) can be performed for offset compensation by means of switches in a special offset phase. It is preferred for this purpose if a capacitor of the SC circuit is coupled to the amplifier input to store the offset. In this way the amplifier can be operated in a feedback loop with unity gain and the offset can be stored in the capacitor.

According to another aspect of the amplifier arrangement, the amplifier arrangement comprises an amplifier based on an inverter stage or a cascode inverter stage.

The amplifier based on an inverter stage represents a particularly power-efficient amplifier stage, specifically for usage in switched capacitor amplifiers. If a higher gain is necessary, the inverter stage can be expanded into a cascode inverter stage and can provide higher gain factors.

According to one aspect, a method for operating an amplifier arrangement comprises a regulation of a supply signal of an amplifier. The supply signal is regulated in such a manner that an operating point of the amplifier is held constant. This initially serves to provide a reference signal. A correction signal is generated based on the amplifier's operating point. The supply signal is then regulated based on the reference signal and the correction signal. Biasing is therefore not provided via a useful signal to be amplified, but via the supply signal.

An advantageous biasing scheme is implemented with the described method for operating an amplifier arrangement.

Specifically, it is possible to define the operating point of the amplifier without using floating voltage sources or additional capacitors. This has the advantage of avoiding signal interference that accompanies the capacitors, which usually have to be chosen in large sizes for amplifier circuits.

Regulating the supply signal based on the correction and reference signals leads to a better power supply rejection ratio (PSSR). An improved bandwidth control is possible due to the amplifier's constant operating point. This allows a defined operation, as a class-AB or class-C amplifier with constant settling, for example. The operating point is advantageously also independent of process and temperature variations.

According to another aspect of the method, the supply signal is regulated by analog means. For this purpose, the correction and reference signals are selected as current or voltage, for example.

The reference signal is provided with a constant transconductance according to one aspect of the method. The correction signal is then generated by means of a reference stage by mirroring the operating point of the amplifier. The correction signal is finally superimposed on the reference signal.

According to another aspect of the method, the supply signal is regulated by digital means.

According to another aspect of the method, a delay of a delay chain is first detected, wherein the delay chain comprises at least one copy of the amplifier, generally several copies. The correction signal is generated by determining the delay of the delay chain by comparison to the reference signal. A digital corrected reference signal is generated by means of a counter, based on the reference signal. This digital corrected reference signal is converted into a corrected reference signal by means of a digital-to-analog converter. This now analog corrected reference signal is used to regulate the supply signal and the supply signal is provided at terminals for the supply signal of the delay chain.

BRIEF DESCRIPTION OF THE DRAWINGS

The invention will be described below for several exemplary embodiments with reference to the figures. Insofar as circuit parts or components correspond to one another in function, a description of them will not be repeated in each of the following figures.

DETAILED DESCRIPTION OF THE DRAWINGS

Figure 1A:
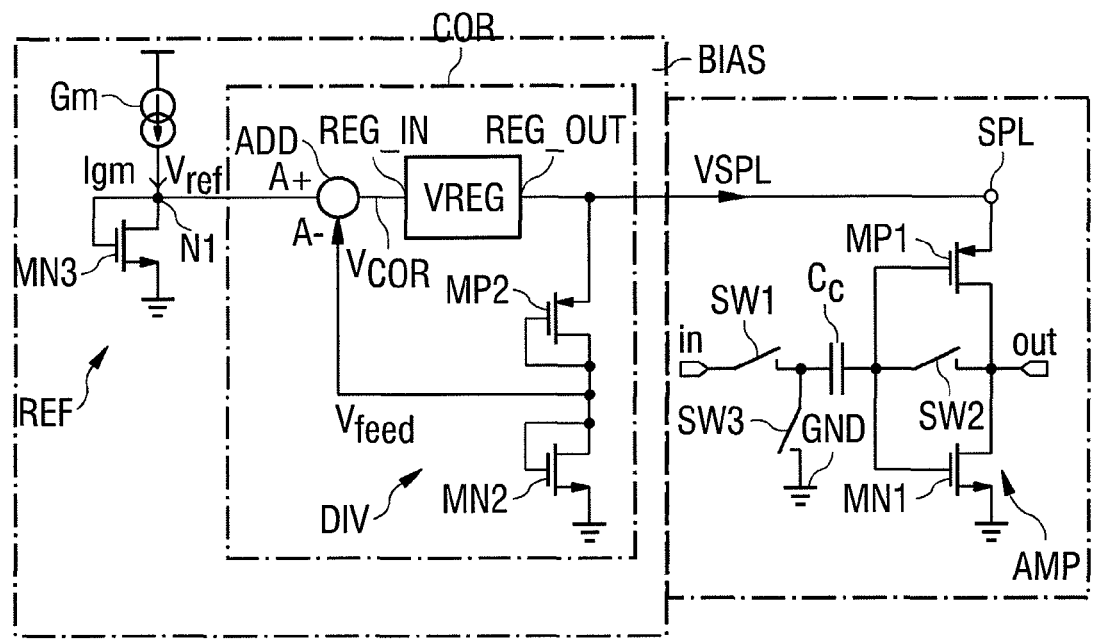
FIG. 1A shows an exemplary embodiment of an amplifier arrangement according to the invention.

FIG. 1A shows an exemplary embodiment of an amplifier arrangement according to the invention. The circuit comprises an amplifier AMP and a bias circuit BIAS. The amplifier AMP and the bias circuit BIAS are connected to one another via a terminal SPL for a supply signal VSPL of the amplifier AMP.

The amplifier AMP in this example comprises an amplifier based on an inverter stage and including first transistors MN1, MP1, which are implemented, for example, as unipolar transistors. These first transistors MN1, MP1 are also connected to one another and to a capacitor Cc according to the principle of a switched-capacitor circuit. In this exemplary embodiment, the amplifier AMP further comprises an amplifier input "in" that can be connected to an amplifier output "out" via a series circuit having a first switch SW1, the capacitor Cc and a second switch SW2. The amplifier also has a third switch SW3, which is coupled between the first switch SW1 and the capacitor Cc and can also be connected to a ground potential GND.

The bias circuit BIAS comprises a reference circuit REF and a correction device COR. The reference circuit REF further comprises a constant transconductance power source Gm, which is connected by a node N1 to a diode-connected reference transistor. MN3. The reference circuit REF is connected by the node N1 between the constant transconductance current source Gm and the reference transistor MN3 to the correction circuit COR, and to an adder ADD via the latter's first input A+. The adder ADD is connected on the output side to a regulator input REG_IN of a signal regulator VREG. A regulator output REG_OUT of the signal regulator VREG is connected to the terminal SPL for the supply signal VSPL of the amplifier AMP, and is coupled by a feedback stage DIV to a second input A− of the adder ADD. The feedback stage DIV comprises a transistor-based voltage divider made of first transistors MP2, MN2, which are connected by a diode connection in the manner of a voltage divider.

By means of the bias circuit BIAS connected to the terminal SPL for the supply signal VSPL, an operating point of the amplifier AMP is regulated to be constant during its operation. For this purpose, a reference signal VREF with a constant transconductance over process and temperature variations is provided by the constant transconductance current source Gm.

In the selected example, a reference voltage VREF is generated by the diode-connected reference transistor MN3 from a transconductance current Igm from the transconductance current source Gm. This is superimposed at the inputs A+, A− of the adder ADD by a correction signal Vfeed. The correction signal Vfeed is generated by the correction device COR and is likewise a voltage, for example. For this purpose, the supply signal provided at the regulation output REG_OUT, or here, the supply voltage VSPL, is fed back by means of the transistor-based voltage divider MP2, MN2 to the adder ADD at the latter's input A−. In this case, and preferably, the transistor-based voltage divider MP2, MN2 emulates the amplifier AMP. For this purpose, the transistor-based voltage divider MP2, MN2 can comprise similar or scaled transistors MP2, MN2. Thus it is possible to mirror the adjusted operating point on the amplifier AMP by the transistor-based voltage divider MP2, MN2 and to feed a proportional signal or the correction signal Vfeed to the adder ADD.

Therefore, on the input side the reference voltage VREF and the correction signal Vfeed are present at the adder ADD and are compared to one another, for example, and thus yield a corrected reference signal VCOR. This corrected reference signal VCOR is then regulated by the signal regulator VREG to form the supply voltage VSPL and is supplied to the amplifier AMP at the input SPL for a supply signal VSPL. Due to the properties of the constant transconductance current source Gm, namely the constancy of the transconductance Gm, the operating point on the amplifier AMP is held constant by adjusting the supply signal VSPL according to the constant transconductance.

With the aid of the device presented above, it is possible to control the operating point OP of the amplifier AMP via the terminal SPL for a supply signal, or via the supply voltage VSPL. The current source Gm with constant transconductance is used instead of a constant voltage regulation which is often used with pseudo-differential amplifiers of the type discussed here due to the low power supply rejection ratio.

It is therefore possible to hold the bandwidth of the amplifier AMP constant, even though changes in the capacitive load and the sampling frequency may occur. These changes lead to a constant settling behavior despite changing process and temperature variations. The proposed biasing scheme, which is implemented by the bias circuit BIAS, does not use any floating voltage sources and corresponding capacitors to define the operating point of the amplifier AMP. Typically long charging cycles can be avoided in this manner. Signal interference due to the capacitances in batteries is likewise avoided.

Because signal regulators VREG are already present in commercial amplifier types, this circuit element is advantageously used and an improved power supply rejection ratio is also achieved. In addition, for a class-AB or class-C operation of the amplifier AMP, for example, the bandwidth can be controlled and a constant settling behavior across processing temperature variations can be achieved.

Figure 1B:
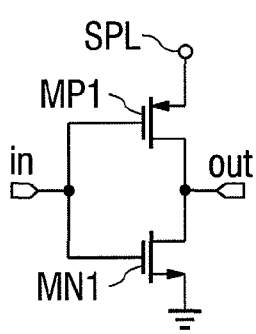
FIGS. 1B, 1C, and 1D respectively show exemplary embodiments of an amplifier for use in an amplifier arrangement according to the invention.
Figure 1C:
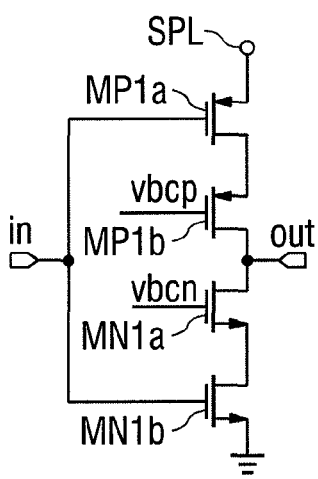
Figure 1D:
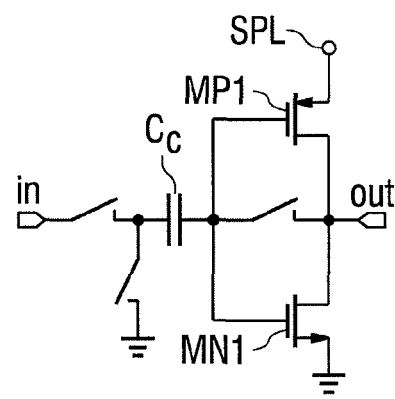

FIGS. 1B, 1C and 1D each show exemplary embodiments of amplifiers AMP for use with the amplifier arrangement according to the invention. FIG. 1B shows an amplifier that is based on an inverter stage made from first transistors MN1, MP1 that are connected into an inverter stage. Such an amplifier stage is particularly power-efficient.

FIG. 1C on the other hand shows an expansion in comparison to an amplifier based on an inverter stage and presents a cascode inverter stage basis. Such an amplifier comprises a series circuit of additional first transistors MP1a, MP1b and MN1a, MN1b. Additional supply terminals vbcp, vbcn are required, however, and are likewise regulated by the supply terminals, as will be explained in connection with FIG. 2. Such a cascode inverter stage is advantageously used if higher gain factors are required.

FIG. 1D shows an exemplary amplifier with a switched capacitor circuit, which is suitably used together with the proposed bias circuit BIAS. The amplifier AMP substantially corresponds in structure to the amplifier already described in FIG. 1A.

An offset compensation can additionally be realized by switches SW1, SW2, SW3. Precisely in amplifiers based on inverter stages or single-stage amplifiers AMP as disclosed herein, an offset that is difficult to characterize due to lack of reference potentials appears at corresponding amplifier inputs N and amplifier outputs out. A so-called correlated double sampling (CDS) for compensating the offset can be performed by the switches SW2, SW3 and the capacitor Cc. It is preferred for this purpose that the capacitor Cc be coupled to the amplifier input "in" in order to store the offset. In this way the amplifier can be operated in a feedback loop with unity gain and a charge proportional to the offset can be stored in the capacitor Cc for further use and offset compensation. The amplifier AMP with offset compensation can be operated in a special offset phase that can be activated by means of the first switch SW1.

Figure 2:
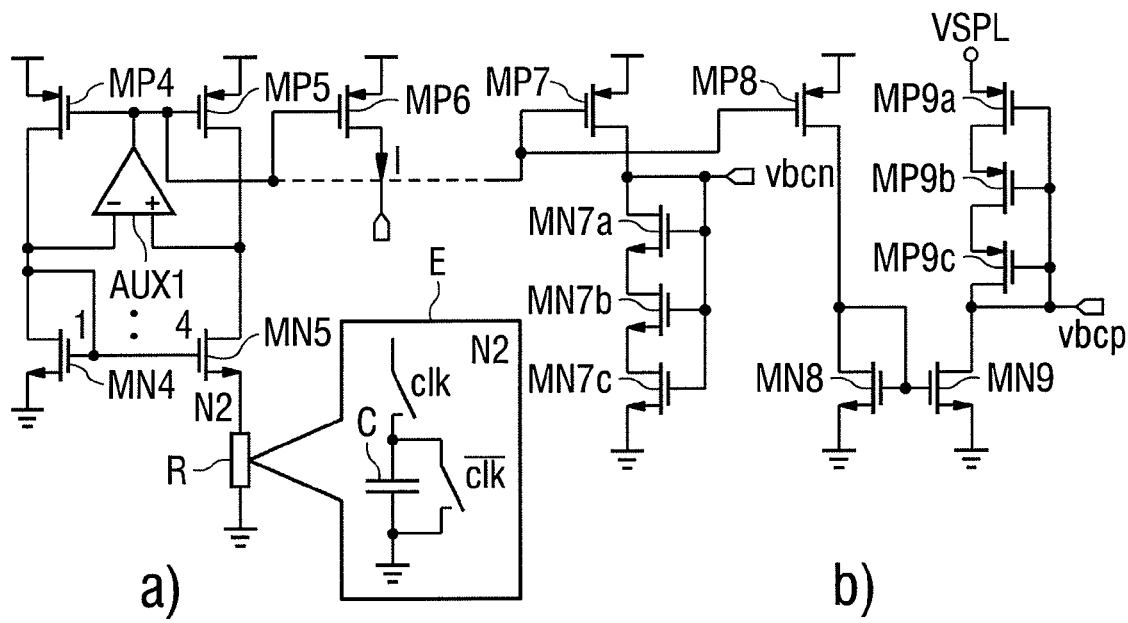
FIG. 2 shows an exemplary embodiment of a constant transconductance current source according to the invention.

FIG. 2 shows a constant transconductance current source Gm according to the invention. The left part of the circuit, marked a), shows a transconductance current source as can be used with amplifiers based on inverter stages and other amplifier types AMP. The circuit is based on a current mirror MN4, MN5. The transistors MN4, MN5 are scaled with a predetermined ratio relative to one another, e.g., 1 to 4. The current mirror MN4, MN5 is expanded by the transistors MP4, MP5, which are connected along their respective control sides and thus from a first transistor path MP4, MN4 and a second transistor path MP5, MN5. An auxiliary amplifier AUX1 is connected on its input side between the first and the second transistor paths. On the output side, the auxiliary amplifier AUX1 is connected to a control path that connects the control terminals of the transistors MP4 and MP5. An additional transistor MP6, which is connected by its control terminal to the control path, is used to couple out a current Igm with constant transconductance.

The transistor MN5 is connected to ground potential by a resistor R. Alternatively, the circuit from the equivalent circuit diagram E can be used at a node between transistor MN5 and resistor R. This is advisable if the current source Gm is to be used with an amplifier AMP in a switched capacitor circuit.

The constant transconductance current supply presented here provides the current Igm with constant transconductance. Under the assumption that all transistors used in the current source are in a state of strong inversion, the current Igm results as $$I_{Gm} = \frac{2}{\mu_n C_{ox} W/L} \frac{1}{R^2}$$

where μn corresponds to the effective mobility of the charge carriers, Cox to the capacitance of the oxide layer, W to the gate width and L to the gate length of the transistors. In the embodiment with the equivalent circuit E, the following holds, depending on a clock frequency fCLK or a reference clock signal clk and the equivalent capacitance C:

$$I_{Gm} = \frac{2}{\mu_n C_{ox} W/L} \left(\frac{f_{CLK} \cdot C}{2}\right)^2$$

The assumption of the state of strong inversion can certainly be weakened during the operation of the current source and can be described better by a moderate inversion. The indicated value for the current Igm should therefore be viewed as a limit value.

For the case where the transistors used comprise NMOS and PMOS transistors, the transconductance gm,n for NMOS transistors results as $$g_{m,n} = \sqrt{2\mu_n C_{ox} W/L I_D}$$

If the constant conductance current source Gm or the constant conductance current Igm is used to operate the bias circuit BIAS, the transconductance for the amplifier AMP is $$gm = \frac{1}{R}$$

or in the embodiment with the equivalent circuit E $$gm \propto \text{const} \cdot f_{clk} \cdot C$$

In the examples presented here, the transconductance thus depends only on the constant resistance value R or is proportional to the clock frequency fclk and the equivalent capacitance C.

In this manner, the bandwidth of the amplifier AMP is constant, even though the clock frequency fclk and the capacitive charge of the amplifier can change.

The current sources with a constant transconductance presented here have an exemplary character. Other embodiments are equally conceivable.

Another example is shown in the part of FIG. 2 identified as b). For use with cascode inverter stages, the constant transconductance current source Gm can be expanded in order to provide the cascode inverter stage with additional supply signals VSPL at additional first and second supply terminals vbcn and vbcp.

For this purpose, the control path from a) is further connected to a control terminal of a transistor MP7. A third transistor path comprises the transistor MP7 and diode-connected transistors MN7a, MN7b, MN7c. The first supply terminal vbcn is connected to the diode-connected transistors MN7a, MN7b, MN7c via respective control sides and is coupled to the transistor MP7.

In addition, the control path from a) is connected to a fourth transistor path MP8, MN8, which is connected in the manner of a current mirror to a fifth transistor path MN9, MP9a, MP9b, MP9c. The fifth transistor path MN9, MP9a, MP9b, MP9c again comprises diode-connected transistors MP9a, MP9b, MP9c. The second supply terminal vbcp is connected to the totem pole circuit MP9a, MP9b, MP9c via respective control sides and is coupled to the transistor MN9.

With the extension shown in part b), a cascode inverter stage can also be supplied with supply signals VSPL via the respective supply terminals SPL, vbcp, vbcn with constant transconductance, and accordingly the operating point can be held constant across process and temperature variations. The embodiment shown in b) has an exemplary character. Other embodiments are equally conceivable.

Figure 3:
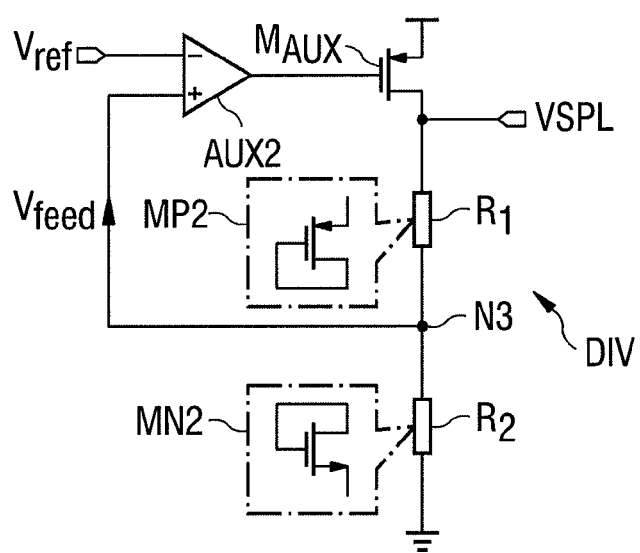
FIG. 3 shows an exemplary embodiment of a correction device according to the invention and FIG. 4 shows an exemplary embodiment of a digital device according to the invention.

FIG. 3 shows a signal regulator for use with an amplifier arrangement according to the invention. The signal regulator VREG comprises a second auxiliary amplifier AUX2, which is coupled on the input side to the correction signal Vfeed and the reference signal Vref as provided by the constant transconductance current source Gm. On the output side, the second auxiliary amplifier AUX2 is connected to an auxiliary transistor MAUX that is connected to a path MAUX, R1, R2 with the feedback stage DIV. The supply signal VSPL is tapped off between the connection of the auxiliary transistor MAUX and the feedback stage DIV.

The feedback stage DIV comprises two resistors R1, R2, which are implemented as transistors MP2, MN2. The correction signal Vfeed is produced in this manner, and is generated based on the operating point OP of the amplifier AMP.

Figure 4:
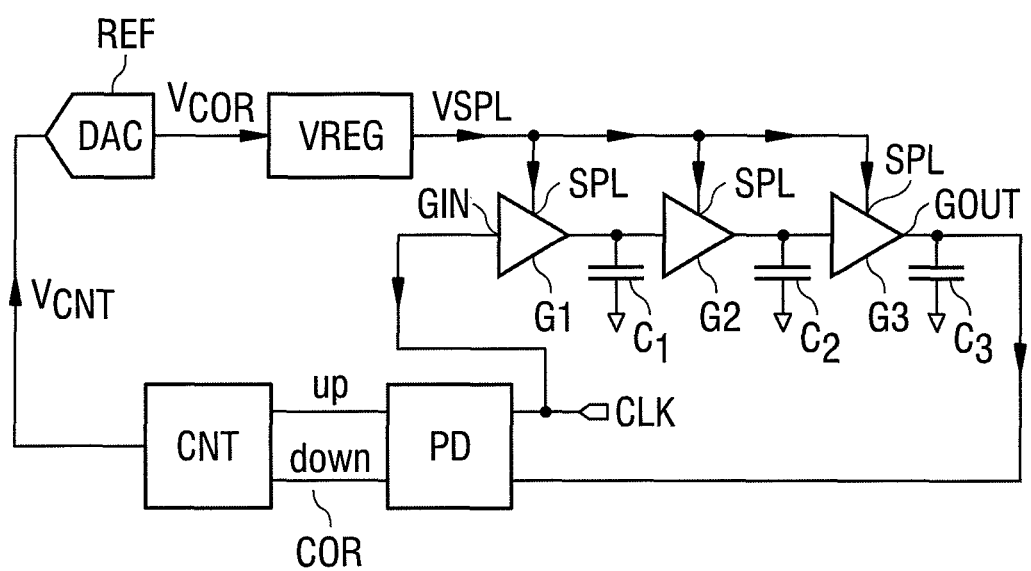

FIG. 4 shows a digital solution of an amplifier arrangement according to the invention. The amplifier arrangement comprises a delay chain G1, G2, G3. The delay chain G1, G2, G3 comprises copies G1, G2, G3 of the amplifier, which are connected in series. The copies G1, G2, G3 of the amplifier AMP each have terminals SPL for the supply signal VSPL. The delay chain G1, G2, G3 is also coupled to the capacitors C1, C2, C3, which emulate a capacitive load.

The correction device COR further comprises a phase detector PD, which is connected to an output and an input GIN, GOUT of the delay chain. A counter CNT is connected to the phase detector and to an input of a digital-to-analog converter DAC. A phase-locked loop can be implemented in this manner. The output of digital-to-analog converter DAC is coupled to the signal regulator VREG which outputs the supply signal VSPL to the terminals SPL.

In principle, the operating point OP of an amplifier determines its transconductance, which, along with the output capacitance, is a determining variable for the bandwidth of the amplifier. There is in turn a connection between the bandwidth of the amplifier AMP and the time delay if this amplifier is used in the delay chain G1, G2, G3. The operating point OP can therefore also be regulated with the supply signal VSPL by constructing copies G1, G2, G3 of the amplifier AMP, which copies can be scaled in current and surface area, in the delay chain G1, G2, G3.

For this purpose, the correction device COR is set up to generate the correction signal Vfeed by means of comparison to the reference clock signal CLK. In this embodiment, a reference clock signal CLK from a clock generator corresponds to the reference signal VREF. The comparison is performed with reference to the reference clock signal CLK and with aid of a regulation loop constructed in the manner of a delay-locked loop (DLL). The counter CNT is accordingly set up to generate a digital corrected reference signal VCNT based on the correction signal up, down. The digital corrected reference signal VCNT is incremented digitally if the delay of the delay chain G1, G2, G3 is greater than the reference clock signal CLK. Accordingly, the digital corrected reference signal VCNT is decremented digitally if the delay of the delay chain G1, G2, G3 is less than the reference clock signal CLK. The incrementation or decrementation is accomplished by the correction signal up, down.

The digital corrected reference signal VCNT is present at the digital-to-analog converter DAC or at its input. The digital-to-analog converter DAC subsequently converts the digital corrected reference signal VCNT into the corrected reference signal VCOR and makes it available at its output. This now-analog corrected reference signal VCOR is supplied to the terminals SPL for the supply signal VSPL in order to regulate the operating point OP of the amplifier.

This embodiment pursues a digital approach in a certain sense, which is especially interesting wherever surface area and current for digital blocks become increasingly smaller (for example in ultra-small scale CMOS integration, Deep-submicron CMOS). Moreover, the reference signal can be kept within defined limits, in contrast to an analog solution in which the reference signal typically follows a Gaussian distribution. This solution is applied if, due to the finite resolution of the digital reference signal in comparison to an analog solution, larger errors are not of great importance. To achieve high precision, a large number of bits can be chosen for the digital counter CNT and digital-to-analog converter DAC.

In another exemplary embodiment, not shown, the delay chain G1, G2, G3 is connected to a ring oscillator by coupling the output and input of the delay chain GIN, GOUT to one another. The phase detector PD is constructed as a phase frequency detector and the counter CNT is replaced by a digital filter. A phase-locked loop PLL is implemented in this manner.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. An amplifier arrangement comprising:
   an amplifier with a terminal for a supply signal; and
   a bias circuit for providing the supply signal at the terminal in such a manner that an operating point of the amplifier is held constant by means of the supply signal, the bias circuit comprising:
      a reference circuit for providing a reference signal, the reference circuit comprising a constant transconductance current source, and wherein the reference signal is generated based on a constant transconductance current from the transconductance current source, and
      a correction device with which the supply signal is regulated based on the reference signal and a correction signal, the correction signal being dependent on the operating point of the amplifier.

2. The amplifier arrangement according to claim 1, wherein the amplifier has an amplifier input for the supply of a useful signal and an amplifier output for outputting an amplified signal.

3. The amplifier arrangement according to claim 2, wherein the correction device comprises:
   a feedback path that is coupled to the reference circuit and is set up to generate the correction signal based on the useful signal at the amplifier input and/or the amplified signal at the amplifier input, or
   a feedback stage, that is set up to mirror the operating point of the amplifier and to generate the correction signal.

4. The amplifier arrangement according to claim 3, wherein the correction device comprises a signal regulator that includes:
   a regulator input, which is connected to an output of an adder and at which a corrected reference signal is present, wherein the adder is connected by means of a first input to the reference circuit and by a second input to the feedback stage in order to superimpose the reference signal and the correction signal, and
   a regulator output that is connected to the feedback stage and the terminal for a supply signal.

5. The amplifier arrangement according to claim 3, wherein the feedback stage comprises a voltage divider implemented by transistors.

6. The amplifier arrangement according to claim 1, wherein:
   the amplifier comprises a delay chain and has at least one copy of the amplifier,
   the at least one copy of the amplifier and the amplifier have terminals for the supply signal,
   the correction device comprises a phase detector that is coupled to the delay chain and is set up to generate the correction signal by comparison to the reference signal, a counter, that is connected to the phase detector and is set up to generate a digital corrected reference signal based on the correction signal, a digital-to-analog converter that is coupled to the counter by an input and is set up to convert a digital corrected reference signal into a corrected reference signal and provide it at an output, and the output of the digital-to-analog converter is connected to the terminals for the supply signal.

7. The amplifier arrangement according to claim 1, wherein the amplifier has an SC circuit.

8. The amplifier arrangement according to claim 6, wherein the SC circuit comprises a capacitor that can be connected by means of switches to the amplifier input in order to store an offset for offset compensation in an offset phase.

9. The amplifier arrangement according to claim 1, wherein the amplifier comprises an amplifier based on an inverter stage or based on a cascode inverter stage.

10. A method for operating an amplifier arrangement, comprising:
regulating a supply signal of an amplifier in such a manner that the operating point of the amplifier is held constant, comprising:
providing a reference signal,
generating a correction signal based on the operating point of the amplifier, and
regulating the supply signal based on the reference signal and the correction signal, wherein:
the reference signal with a constant transconductance is provided,
the correction signal is generated by means of a feedback stage by mirroring the operating point of the amplifier,
the correction signal is superimposed on the reference signal, and wherein a supply signal of an amplifier is regulated by analog means.

11. The method according to claim 10, wherein a supply signal of an amplifier is regulated by a signal generator coupled to an output of a digital-to-analog converter.

12. The method according to claim 11, comprising:
detecting a delay of a delay chain, having at least one copy of the amplifier,
generating the correction signal by comparing the delay of the delay chain to the reference signal,
generating a digital corrected reference signal by means of a counter based on the correction signal,
generating the corrected reference signal based on the digital corrected reference signal by means of the digital-to-analog converter,
regulating the supply signal based on the corrected reference signal, and
providing the supply signal at terminals of the delay chain for the supply signal.

* * * * *